US012740381B2

(12) United States Patent
Feng et al.

(10) Patent No.: US 12,740,381 B2
(45) Date of Patent: Sep. 15, 2026

(54) METHOD FOR STACKING MULTI-LAYER WAFERS, AND SYSTEM FOR STACKING MULT-LAYER WAFERS

(71) Applicant: WUHAN XINXIN SEMICONDUCTOR MANUFACTURING CO., LTD., Wuhan (CN)

(72) Inventors: Yicheng Feng, Wuhan (CN); Yuheng Huang, Wuhan (CN); Bang Chen, Wuhan (CN); Shengjin Song, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 747 days.

(21) Appl. No.: 18/155,712

(22) Filed: Jan. 17, 2023

(65) Prior Publication Data

US 2023/0154805 A1 May 18, 2023

Related U.S. Application Data

(63) Continuation of application No. PCT/CN2020/123335, filed on Oct. 23, 2020.

(30) Foreign Application Priority Data

Sep. 18, 2020 (CN) ......................... 202010990047.2

(51) Int. Cl.

| | |
|---|---|
| ***H10P 74/00*** | (2026.01) |
| ***H10P 72/50*** | (2026.01) |
| ***H10W 46/00*** | (2026.01) |

(52) U.S. Cl.

CPC .............. *H10P 74/23* (2026.01); *H10P 72/50* (2026.01); *H10W 46/00* (2026.01); *H10W 46/301* (2026.01)

(58) Field of Classification Search

CPC ..... H01L 22/20; H01L 22/12; H01L 21/6835; H01L 21/185; H01L 21/67259

See application file for complete search history.

(56) References Cited

U.S. PATENT DOCUMENTS

| | | | |
|---|---|---|---|
| 2002/0039828 A1 | 4/2002 | Hahmann et al. | |
| 2006/0017907 A1* | 1/2006 | Yang | G03F 9/7003 355/72 |
| 2018/0144999 A1* | 5/2018 | Lu | H01L 24/75 |

FOREIGN PATENT DOCUMENTS

| | | |
|---|---|---|
| CN | 106483770 A | 3/2017 |
| CN | 106547171 A | 3/2017 |

(Continued)

OTHER PUBLICATIONS

International search report ,PCT/CN2020/123335 mailed Jun. 23, 2021 (13 pages).

(Continued)

*Primary Examiner* — Alexander G Ghyka

(57) ABSTRACT

A method for stacking multi-layer wafers, and a system for stacking multi-layer wafers. The method includes bonding a wafer to a carrier wafer; a first feature pattern being defined in the wafer; acquiring overlay deviation values of different positions of the first feature pattern relative to the carrier wafer; fitting the overlay deviation values corresponding to the different positions and obtaining an actual deviation value of the wafer; and compensating an exposure process of the wafer based on the actual deviation value. In this way, an occurrence of the wafer failing to be exposed and being (Continued)

scrapped due to an alignment accuracy between the wafer and the carrier wafer being lower may be reduced.

18 Claims, 3 Drawing Sheets

(56) References Cited

FOREIGN PATENT DOCUMENTS

| | | | |
|---|---|---|---|
| CN | 109884862 | A | 6/2019 |
| CN | 110416078 | A | 11/2019 |
| CN | 111591955 | A | 8/2020 |

OTHER PUBLICATIONS

Chinese First Office Action, Chinese Application No. 202010990047.2, mailed Jul. 26, 2023 (18 pages).

* cited by examiner

METHOD FOR STACKING MULTI-LAYER WAFERS, AND SYSTEM FOR STACKING MULT-LAYER WAFERS

CROSS REFERENCE TO RELATED APPLICATIONS

The present disclosure is a continuation of International (PCT) Patent Application No. PCT/CN2020/123335 filed on Oct. 23, 2020, which claims priority to Chinese Patent Application No. 202010990047.2, filed on Sep. 18, 2020, tiled "METHOD FOR STACKING MULTI-LAYER WAFERS, AND SYSTEM FOR STACKING MULT-LAYER WAFERS", the entire contents of which are hereby incorporated by reference in their entireties.

TECHNICAL FIELD

The present disclosure relates to the technical field of integrated circuit equipment, and in particular to a method for stacking multi-layer wafers and a system for stacking multi-layer wafers.

BACKGROUND

With a continuous development of a semiconductor technology, a three-dimensional integrated circuit (3D-IC) technology has been widely applied. The 3D-IC technology achieves stacking the multi-layer wafers through stacking and bonging different wafers together by means of a wafer-level packaging technology.

In the related art, in a process of stacking the multi-layer wafers, a temporary bonding process is widely used due to the temporary bonding process playing an important role in reducing a manufacturing cost of a wafer and improving a market competitiveness of a product. However, the temporary bonding process requires a lot for an alignment accuracy between the wafer and a carrier wafer. In order to achieve an alignment between the wafer and the carrier wafer, a general way is to read a signal of a bottom notch of the wafer to align the wafer and the carrier wafer, and subsequently a bonding process of the wafer and the carrier wafer is completed.

However, the alignment accuracy between the wafer and the carrier wafer described above depends on a capability of a machine, and an error may be larger. Similarly, in a lithography process, a signal of the bottom of the wafer may be also required to be read for a rough alignment. After the rough alignment is completed, a precise aligning process may be performed for a corresponding feature pattern, and finally an exposure process is completed. Whereas, the alignment accuracy of the temporary bonding process is far less than the alignment accuracy of the lithography process, thereby a problem may exist therein. The problem is that after the temporary bonding process is completed between two wafers, when an overlay error exceeds an allowable error range of an alignment system of a lithography machine, the wafer may fail to be exposed, and the wafer will eventually be scrapped.

SUMMARY OF THE DISCLOSURE

According to a first aspect of the present disclosure, a method for stacking multi-layer wafers is provided and includes bonding a wafer to a carrier wafer, a first feature pattern being defined in the wafer; acquiring overlay deviation values of different positions of the first feature pattern relative to the carrier wafer; fitting the overlay deviation values corresponding to the different positions and obtaining an actual deviation value of the wafer; and compensating an exposure process of the wafer based on the actual deviation value.

In some embodiments, an operation of the bonding a wafer to a carrier wafer includes providing the wafer and the carrier wafer, the wafer including a substrate, a dielectric layer arranged on a side surface of the substrate, and a metal layer embedded in the dielectric layer; and defining the first feature pattern on a side surface of the substrate away from the dielectric layer.

In some embodiments, the operation of the bonding a wafer to a carrier wafer, includes providing the wafer and the carrier wafer, the wafer including a substrate, a dielectric layer arranged on a side surface of the substrate, and a metal layer embedded in the dielectric layer; and defining the first feature pattern on a side surface of the dielectric layer away from the substrate.

In some embodiments, the dielectric layer includes a covering layer arranged on a side surface of the substrate; a bonding layer arranged on a side surface of the covering layer away from the substrate; and a protecting layer arranged on a side surface of the bonding layer away from the covering layer. An operation of the defining the first feature pattern on a side surface of the dielectric layer away from the substrate, includes defining the first feature pattern in a process of fabricating the protecting layer.

In some embodiments, the operation of the bonding a wafer to a carrier wafer, includes providing the wafer and the carrier wafer, the wafer including a substrate, a dielectric layer arranged on a side surface of the substrate, a metal layer embedded in the dielectric layer, and a bonding pad connected to the metal layer and exposed to a side surface of the dielectric layer away from the substrate; arranging a barrier layer on the side surface of the dielectric layer away from the substrate, such that the bonding pad is covered by the barrier layer; and defining the first feature pattern on the barrier layer.

In some embodiments, an operation of the acquiring overlay deviation values of different positions of the first feature pattern relative to the carrier wafer, includes acquiring actual coordinates of the different positions of the first feature pattern relative to the carrier wafer and rotating angles of the different positions of the first feature pattern relative to the carrier wafer; and acquiring difference values between the actual coordinates corresponding to the different positions and corresponding theoretical coordinates, and acquiring horizontal offsets in a horizontal axis direction corresponding to the different positions and horizontal offsets in a vertical axis direction corresponding to the different positions.

In some embodiments, an operation of the fitting the overlay deviation values corresponding to the different positions and obtaining an actual deviation value of the wafer, includes performing a ternary fitting process for the horizontal offsets in the horizontal axis direction corresponding to the different positions, the horizontal offsets in the vertical axis direction corresponding to the different positions, and rotating arc lengths corresponding to the different positions, and obtaining the actual deviation value of the wafer. A rotating arc length of each position is a product of a distance between the position and a center of the wafer and a corresponding rotating angle.

In some embodiments, the different positions of the first feature pattern include multiple spacing points of the first feature pattern arranged at intervals along the same direction.

In some embodiments, the multiple spacing points are arranged at an equal interval.

According to a second aspect of the present disclosure, a system for stacking multi-layer wafers is provided and includes a measuring device configured to acquire overlay deviation values of different positions of a first feature pattern on a wafer relative to a carrier wafer after bonding the wafer to the carrier wafer, and configured to fit the overlay deviation values corresponding to the different positions and obtain an actual deviation value of the wafer; and a compensating device connected to the measuring device and configured to compensate an exposure process of the wafer based on the actual deviation value.

In some embodiments, the system for stacking multi-layer wafers includes a bonding device configured to bond the wafer to the carrier wafer.

In some embodiments, the bonding device is configured to provide the wafer and the carrier wafer, the wafer including a substrate, a dielectric layer arranged on a side surface of the substrate, and a metal layer embedded in the dielectric layer, and define the first feature pattern on a side surface of the substrate away from the dielectric layer.

In some embodiments, the bonding device is configured to provide the wafer and the carrier wafer, the wafer including a substrate, a dielectric layer arranged on a side surface of the substrate, and a metal layer embedded in the dielectric layer, and define the first feature pattern on a side surface of the dielectric layer away from the substrate.

In some embodiments, the dielectric layer includes a covering layer arranged on a side surface of the substrate; a bonding layer arranged on a side surface of the covering layer away from the substrate, and a protecting layer, arranged on a side surface of the bonding layer away from the covering layer. The bonding device is further configured to define the first feature pattern in a process of fabricating the protecting layer.

In some embodiments, the bonding device is configured to provide the wafer and the carrier wafer, the wafer including a substrate, a dielectric layer arranged on a side surface of the substrate, a metal layer embedded in the dielectric layer, and a bonding pad connected to the metal layer and exposed to a side surface of the dielectric layer away from the substrate, arrange a barrier layer on the side surface of the dielectric layer away from the substrate, such that the bonding pad is covered by the barrier layer, and define the first feature pattern on the barrier layer.

In some embodiments, the measuring device is further configured to acquire actual coordinates of the different positions of the first feature pattern relative to the carrier wafer and rotating angles of the different positions of the first feature pattern relative to the carrier wafer, and acquire difference values between the actual coordinates corresponding to the different positions and corresponding theoretical coordinates, and acquire horizontal offsets in a horizontal axis direction corresponding to the different positions and horizontal offsets in a vertical axis direction corresponding to the different positions.

In some embodiments, the measuring device is further configured to perform a ternary fitting process for the horizontal offsets in the horizontal axis direction corresponding to the different positions, the horizontal offsets in the vertical axis direction corresponding to the different positions, and rotating arc lengths corresponding to the different positions, and obtain the actual deviation value of the wafer, wherein a rotating arc lengths of each position is a product of a distance between the position and a center of the wafer and a corresponding rotating angle.

In some embodiments, the different positions of the first feature pattern include multiple spacing points of the first feature pattern arranged at intervals along the same direction.

In some embodiments, the multiple spacing points are arranged at an equal interval.

According to a third aspect, a system for stacking multi-layer wafers is provided and includes a measuring device configured to acquire overlay deviation values of different positions of a first feature pattern on the wafer relative to a carrier wafer after bonding the wafer to the carrier wafer; and configured to fit the overlay deviation values corresponding to the different positions and obtain an actual deviation value of the wafer; a compensating device connected to the measuring device and configured to compensate an exposure process of the wafer based on the actual deviation value; and an exposing device connected to the compensating device and configured to perform an exposure process for the multi-layer wafers.

DETAILED DESCRIPTION

Figure 1:
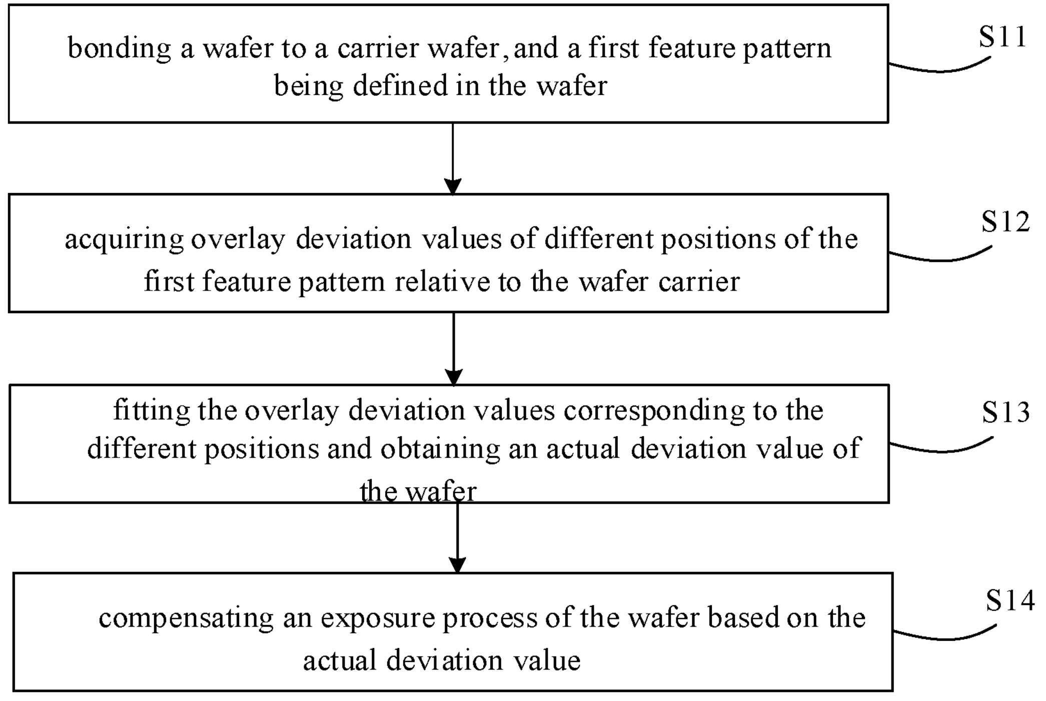
FIG. 1 is a flowchart of a method for stacking multi-layer wafers according to an embodiment of the present disclosure.

Technical solutions in the embodiments of the present disclosure will be clearly and completely described in the following with reference to accompanying drawings in the embodiments of the present disclosure. Obviously, the embodiments described are simply a part of but not all the embodiments of the present disclosure. Based on the embodiments in the present disclosure, all other embodiments obtained by those of ordinary skill in the art without creative efforts shall fall within a protection scope of the present disclosure.

Terms such as "first", "second", and the like in the present disclosure, are used herein for purposes of description, and are not intended to indicate or imply relative importance or significance or to imply the number of indicated technical features. Thus, the feature defined with “first”, “second”, and the like may include one or more of such a feature. In the description of the present disclosure, it should be noted that, “a plurality of” means two or more, unless specified otherwise. All the directional indicator (such as up, down, left, right, front, rear . . . ) in embodiments of the present disclosure are only used for explaining relative positions, the movements, and the like between components in a specific posture (as shown in the drawings). If the specific posture changes, the directional indicators may change accordingly. Furthermore, the terms “including” and “having”, and any modification thereof are intended to cover un-exclusive inclusion. For example, a process, method, system, product, or device that may include a series of steps or units is not limited to the listed steps or units, but optionally also may include steps or units not listed, or optionally may include other steps or units inherent to these processes, methods, products, or equipment.

“Embodiment” herein means that a particular feature, structure, or characteristic described with reference to embodiments may be included in at least one embodiment of the present disclosure. The term appearing in various places in the specification are not necessarily as shown in the same embodiment, and are not exclusive or alternative embodiments that are mutually exclusive with other embodiments. Those skilled in the art will understand explicitly and implicitly that the embodiments described herein may be combined with other embodiments.

The present disclosure will be described in detail in the following with reference to the accompanying drawings and the embodiments.

As shown in FIG. 1, FIG. 1 is a flowchart of a method for stacking multi-layer wafers according to an embodiment of the present disclosure. In the embodiment, the method for stacking multi-layer wafers is provided and includes operations S11-S14.

In an operation S11, the method may include bonding a wafer to a carrier wafer, and a first feature pattern being defined in the wafer.

In some embodiments, the temporary bonding process is performed for the wafer 10 and the carrier wafer. A specific process of the temporary bonding process may be referred to prior arts, which will not be repeated herein.

Figure 2:
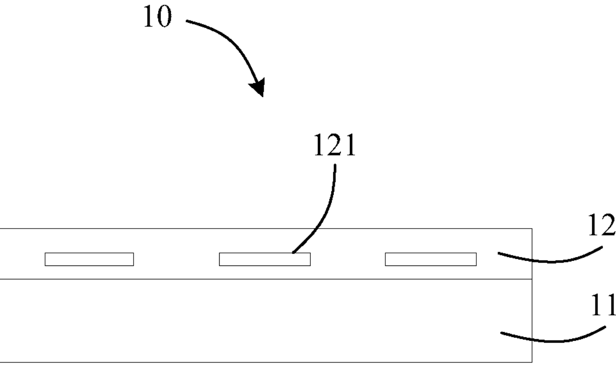
FIG. 2 is a structural schematic view of a wafer according to an embodiment of the present disclosure.

In some embodiments, the operation S11 may include providing the wafer 10 and the carrier wafer. As shown in FIG. 2, FIG. 2 is a structural schematic view of the wafer according to an embodiment of the present disclosure. The wafer 10 may include a substrate 11, a dielectric layer 12 arranged on a side surface of the substrate 11, and a metal layer 121 embedded in the dielectric layer 12. The wafer may be a device wafer. That is, an electronic device such as a semiconductor device, a chip circuit, a through hole or a conductive pad, etc., may be arranged on the substrate 11 of the wafer 10. A device structure of the device wafer may include one or more of a capacitor, a resistor, an inductor, a MOS transistor, an amplifier or a logic circuit which are known. The carrier wafer may include a carrier substrate and a carrier medium layer arranged on a side surface of the carrier substrate. The carrier wafer may be a blank wafer or a waste wafer.

Figure 3:
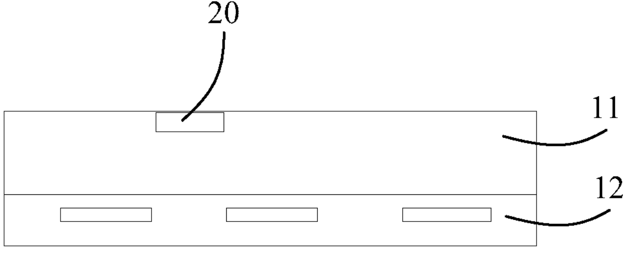
FIG. 3 is a position schematic diagram of a first feature pattern according to a first embodiment of the present disclosure.

Subsequently, the first feature pattern 20 may be defined on the wafer 10, so as to facilitate a measurement for an overlay deviation value of the wafer 10 in a later process. In a specific embodiment, as shown in FIG. 3, FIG. 3 is a position schematic diagram of a first feature pattern according to a first embodiment of the present disclosure. The first feature pattern 20 may be defined on a side surface of the substrate 11 away from the dielectric layer 12, i.e., a rear surface of the wafer 10. The first feature pattern 20 is defined and defined to a blind groove structure having a less depth, such that not only may the overlay deviation value of the wafer 10 be measured in the later process based on the first feature pattern 20, but also the first feature pattern 20 may be simultaneously removed in a process of thinning the substrate 11, so as to avoid an influence of the first feature pattern 20 on the wafer 10. It can be understood that the first feature pattern 20 may also be a dielectric layer deposited on the side surface of the substrate 11 away from the dielectric layer 12.

Figure 4:
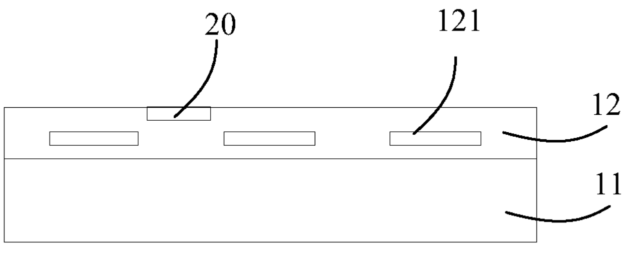
FIG. 4 is a position schematic diagram of the first feature pattern according to a second embodiment of the present disclosure.
Figure 5:
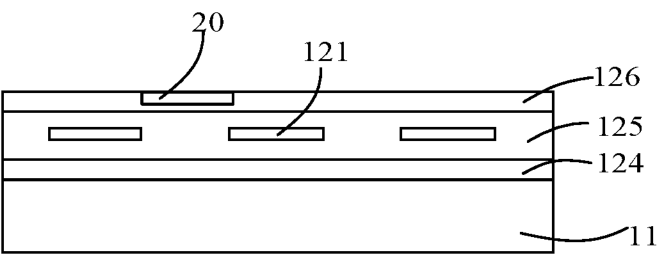
FIG. 5 is a position schematic diagram of the first feature pattern according to a third embodiment of the present disclosure.

In some embodiments, as shown in FIG. 4 and FIG. 5, FIG. 4 is a position schematic diagram of the first feature pattern according to a second embodiment of the present disclosure, and FIG. 5 is a position schematic diagram of the first feature pattern according to a third embodiment of the present disclosure. The second embodiment and the third embodiment correspond to a case where no bonding pad 122 (see FIG. 6 below) is arranged on a side surface of the dielectric layer 12 of the wafer 10 away from the substrate 11. The bonding pad 122 is connected to the metal layer 121 in the dielectric layer 12 and exposed to a side surface of the metal layer 121 away from the substrate 11. In the present embodiments, the first feature pattern 20 may be directly defined on the side surface of the dielectric layer 12 away from the substrate 11. The first feature pattern 20, such as a groove structure, may be obtained by performing an etching process on the dielectric layer 12, and being filled with materials (see FIG. 4). A position of the first feature pattern 20 does not correspond to a position of a position of the metal layer 121. As shown in FIG. 5, in a specific embodiment, the dielectric layer may include a covering layer 124 arranged on a side surface of the substrate, a bonding layer 125 arranged on a side surface of the covering layer 124 away from the substrate, and a protecting layer 126 arranged on a side surface of the bonding layer 125 away from the covering layer 124. All processes before the bonding process may have been performed on the substrate 11. For example, the device structure and an interconnecting layer electrically connected to the device structure. The device structure may be covered by the covering layer 124. The covering layer 124 may be silicon oxide. The interconnecting layer may be in the covering layer 124. The device structure may be a MOS device, a memory device, a chip, and/or other passive device. The interconnecting layer may be a multi-layer structure. The interconnecting layer may include a connecting hole and/or a connecting line. The interconnecting layer may be a metal material, such as tungsten, aluminum, copper, or the like.

The bonding layer 125 may include a bonding material layer for bonding to other wafers. The bonding layer 125 may be a dielectric material, and may be a single-layer structure or multi-layer structure. The bonding layer 125 may include a silicon oxide layer, a nitrogen doped silicon carbide layer, or a fluorinated silicate glass layer for bonding. In an embodiment, the protecting layer 126 may be further arranged on the bonding layer 125, and configured to protect the bonding layer 125 in a subsequent process. The protecting layer 126 may be the silicon oxide. In a specific implementation process, the first feature pattern 20 may be defined in a process of fabricating the protecting layer 126.

Figure 6:
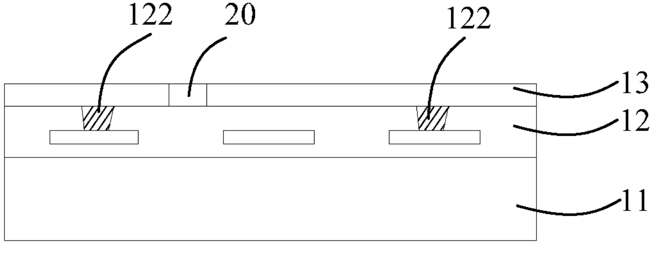
FIG. 6 is a position schematic diagram of the first feature pattern according to a fourth embodiment of the present disclosure.

In some embodiments, as shown in FIG. 6, FIG. 6 is a position schematic diagram of the first feature pattern according to a fourth embodiment of the present disclosure. In a case where the bonding pad 122 is arranged on the side surface of the dielectric layer 12 of the wafer 10 away from the substrate 11, a bonding hole for forming the bonding pad 122 may be directly taken as the first feature pattern 20, such that a possibility of adding a new process flow and accordingly increasing a cost may be reduced. Alternatively, considering that the bonding pad 122 may be influenced by defining the first feature pattern 20 in the dielectric layer 12, in an embodiment, a barrier layer 13 may be arranged on the side surface of the dielectric layer 12 away from the substrate 11, and the first feature pattern 20 may be defined on the barrier layer 13. According to the present embodiment, the first feature pattern 20 may be a groove body or a through hole structure defined in the barrier layer 13. By adding the barrier layer 13 and defining the first feature pattern 20 in the barrier layer 13, not only may the overlay deviation value of the wafer 10 be measured in the later process based on the first feature pattern 20, but also the barrier layer 13 may be simultaneously removed in a debonding process, so as to avoid a damage to the wafer 10. In addition, the barrier layer 13 may be configured to reduce a possibility of a damage or an influence of a temporary bonding glue on the bonding pad 122. The barrier layer 13 may be the silicon oxide layer.

In some embodiments, the first feature pattern 20 on the wafer 10 described above may be all defined or arranged at a position corresponding to a non-device area of the wafer 10. For example, the first feature pattern 20 is defined or arranged at a position where a dicing line is located, such that a possibility of influencing a performance of an electronic component or a possibility of destroying the electronic component may be reduced.

In some embodiments, the first feature pattern 20 described above may substantially be a square, a rectangle, a cross, a circle, or the like.

In an operation S12, the method may include acquiring overlay deviation values of different positions of the first feature pattern relative to the carrier wafer.

Figure 7:
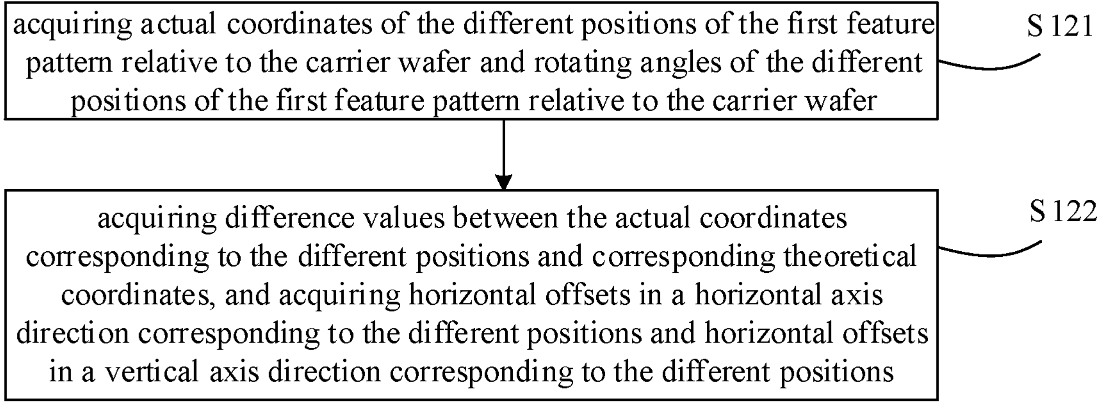
FIG. 7 is a sub-flowchart of an operation S12 in FIG. 1.

As shown in FIG. 7, FIG. 7 is a sub-flowchart of the operation S12 in FIG. 1. The operation S12 may include operations S121-S122.

In an operation S121, the method may include acquiring actual coordinates of the different positions of the first feature pattern relative to the carrier wafer and rotating angles of the different positions of the first feature pattern relative to the carrier wafer.

In some specific embodiments, the actual coordinates of the different positions of the first feature pattern relative to the carrier wafer and the rotating angles of the different positions of the first feature pattern relative to the carrier wafer may be measured and acquired by means of a measuring machine.

In an embodiment, several different positions may be selected from the first feature pattern 20 on the wafer 10. Subsequently, actual coordinates of the several different positions relative to the carrier wafer may be acquired. In some specific embodiments, a second feature pattern may be defined or arranged on the carrier wafer 10. The different positions of the first feature pattern 20 may correspond to different positions of the second feature pattern. That is, actual coordinates of the several different positions of the first feature pattern 20 relative to corresponding positions of the second feature pattern may be acquired at the operation S121.

For example, five different positions, i.e., a position A, a position B, a position C, a position D, and a position E, are selected from the first feature pattern 20. The position A corresponds to a position A' of the second feature pattern, the position B corresponds to a position B' of the second feature pattern, the position C corresponds to a position C' of the second feature pattern, the position D corresponds to a position D' of the second feature pattern, and the position E corresponds to a position E' of the second feature pattern. At the operation S121, an actual coordinate of the position A relative to the position A', an actual coordinate of the position B relative to the position B', an actual coordinate of the position C relative to the position C', an actual coordinate of the position D relative to the position D', and an actual coordinate of the position E relative to the position E' may be acquired.

Figures 8, 9:
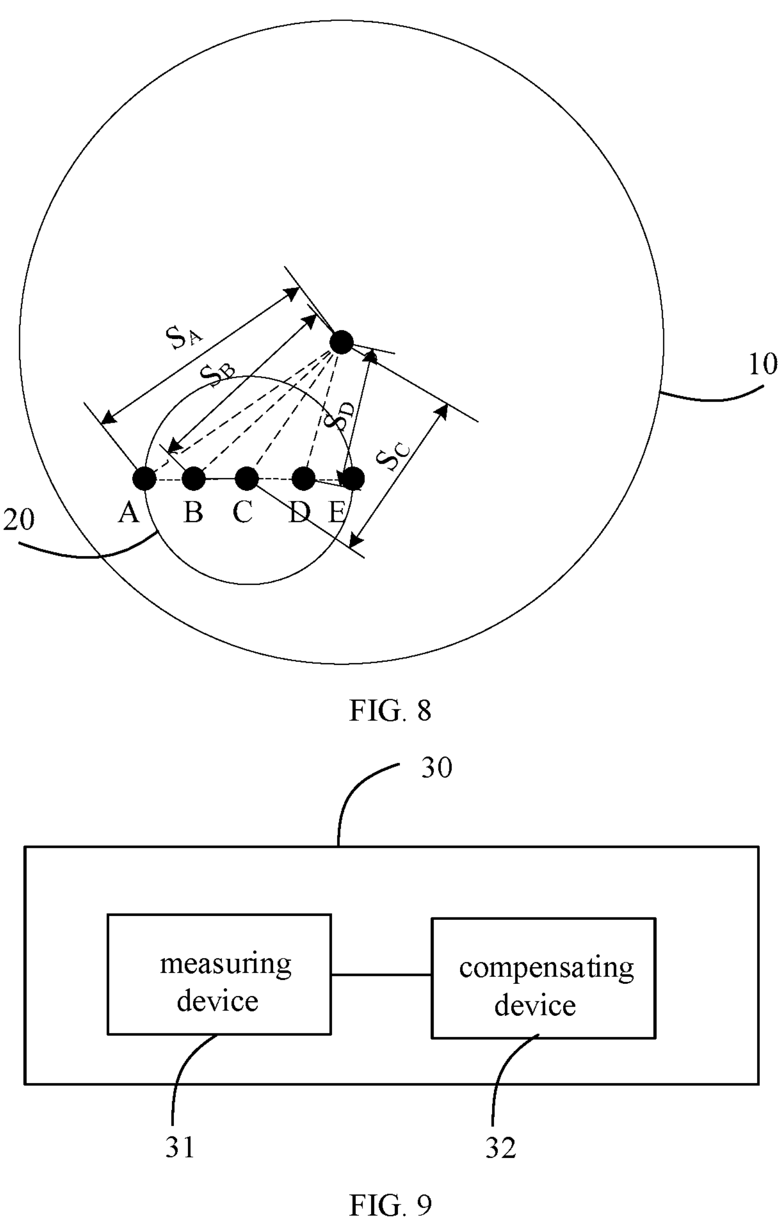
FIG. 8 is a schematic view of distribution of different positions of the first feature pattern according to an embodiment of the present disclosure.
FIG. 9 is a structural schematic diagram of a system for stacking multi-layer wafers according to an embodiment of the present disclosure.

In some specific embodiments, as shown in FIG. 8, FIG. 8 is a schematic view of the distributions of different positions on the first feature pattern according to an embodiment of the present disclosure. The different positions of the first feature pattern 20 may include multiple spacing points t of the first feature pattern 20 arranged at intervals along the same direction, such that an accuracy of a later fitting process. Further, the multiple spacing points are arranged at an equal interval.

In an operation S122, the method may include acquiring difference values between the actual coordinates corresponding to the different positions and corresponding theoretical coordinates, and acquiring horizontal offsets in a horizontal axis direction corresponding to the different positions and horizontal offsets in a vertical axis direction corresponding to the different positions.

In some specific embodiments, the theoretical coordinates of the different positions of the first feature pattern 20 relative to the carrier wafer may be pre-stored. The theoretical coordinates and the actual coordinates may be coordinate values acquired in the same coordinate system. The theoretical coordinates are coordinates of the different positions of the first feature pattern 20 relative to the carrier wafer after the wafer 10 and the carrier wafer are completely aligned.

The operation 122 will be illustrated in the following through an example.

For example, four different positions, i.e., the position A, the position B, the position C, and the position D may be selected from the first feature pattern 20. A theoretical coordinate corresponding to the position A may be $(X_{A0}, Y_{A0})$, and an actual coordinate of the position A may be $(X_{A1}, Y_{A1})$. A theoretical coordinate corresponding to the position B may be $(X_{B0}, Y_{B0})$, and an actual coordinate of the position B may be $(X_{B1}, Y_{B1})$. A theoretical coordinate corresponding to the position C may be $(X_{C0}, Y_{C0})$, and an actual coordinate of the position C may be $(X_{C1}, Y_{C1})$. A theoretical coordinate corresponding to the position D may be $(X_{D0}, Y_{D0})$, and an actual coordinate may be $(X_{D1}, Y_{D1})$. A horizontal offset $\Delta X_A$ in the horizontal axis direction (an X direction) corresponding to the position A may be $X_{A1}$-$X_{A0}$, and a horizontal offset in the vertical axis direction (a Y direction) $\Delta Y_A$ may be $Y_{A1}$-$Y_{A0}$. A horizontal offset $\Delta X_B$ in the horizontal axis direction (the X direction) corresponding to the position B may be $X_{B1}$-$X_{B0}$, and a horizontal offset $\Delta Y_B$ in the vertical axis direction (the Y direction) may be $Y_{B1}$-$Y_{B0}$. A horizontal offset $\Delta X_C$ in the horizontal axis direction (the X direction) corresponding to the position C may be $X_{C1}$-$X_{C0}$, and a horizontal offset $\Delta Y_C$ in the vertical axis direction (the Y direction) may be $Y_{C1}$-$Y_{C0}$. A horizontal offset $\Delta X_D$ in the horizontal axis direction (the X direction) corresponding to the position D may be $X_{D1}$-$X_{D0}$, and a horizontal offset $\Delta Y_D$ in the vertical axis direction (the Y direction) may be $Y_{D1}$-$Y_{D0}$.

In an operation S13, the method may include fitting the overlay deviation values corresponding to the different positions and obtaining an actual deviation value of the wafer.

In some embodiments, an expression of a fitting function may be as follows.

$$\Delta A=\Delta X_A*X+\Delta Y_A*Y+L_A*Z.$$

$$\Delta B=\Delta X_B*X+\Delta Y_B*Y+L_B*Z.$$

$$\Delta C=\Delta X_C*X+\Delta Y_C*Y+L_C*Z.$$

$$\Delta D=\Delta X_D*X+\Delta Y_D*Y+L_D*Z.$$

In some embodiments, ΔA is a fitting function corresponding to the position A, ΔB is a fitting function corresponding to the position B, ΔC is a fitting function corresponding to the position C, and ΔD is a fitting function corresponding to the position D. $\Delta X_A$ is the horizontal offset in the X direction corresponding to the position A, $\Delta X_B$ is the horizontal offset in the X direction corresponding to the position b, $\Delta X_C$ is the horizontal offset in the X direction corresponding to the position C, and $\Delta X_D$ is the horizontal offset in the X direction corresponding to the position D. $\Delta Y_A$ is the horizontal offset in the Y direction corresponding to the position A, $\Delta Y_B$ is the horizontal offset in the Y direction corresponding to the position B, $\Delta Y_C$ is the horizontal offset in the Y direction corresponding to the position C, and $\Delta Y_D$ is the horizontal offset in the Y direction corresponding to the position D. $\Delta L_A$ is a rotating arc length corresponding to the position A, $\Delta L_B$ is a rotating arc length corresponding to the position B, $\Delta L_C$ is a rotating arc length corresponding to the position C, and $\Delta L_D$ is a rotating arc length corresponding to the position D. In some specific embodiments, a fitting process may be performed for a function ΔA, a function ΔB, a function ΔC, and a function ΔD. That is, a ternary fitting may be performed for the horizontal offsets in the horizontal axis direction corresponding to the different positions, the horizontal offsets in the vertical axis direction corresponding to the different positions, and rotating arc lengths corresponding to the different positions, and the actual deviation value of the wafer 10 may be obtained. In some embodiments, a specific fitting method may be a conventional ternary fitting method. Reference may be made to the prior art for details, which will not be repeated here.

In some embodiments, as shown in FIG. 8, the rotating arc length of the each position is a product of a distance between the position and a center O of the wafer 10 and a corresponding rotating angle. Continuing to take the above specific embodiments as an example, the position A, the position B, the position C, and the position D are four different positions on the first feature pattern 20. O is the center of the wafer 10. A rotating arc length corresponding to the position A may be a product of a distance $S_A$ between the position A and the center O of the wafer 10 with a rotating angle $\alpha_A$, i.e., $S_A*\alpha_A$, a rotating arc length corresponding to the position B may be a product of a distance SB between the position B and the center O of the wafer 10 with a rotating angle $\alpha_B$, i.e., $SB*\alpha_B$, a rotating arc length corresponding to the position C may be a product of a distance $S_C$ between the position C and the center O of the wafer 10 with a rotating angle $\alpha_C$, i.e., $S_C*\alpha_C$, and a rotating arc length corresponding to the position D may be a product of a distance $S_D$ between the position D and the center O of the wafer 10 with a rotating angle $\alpha_D$, i.e., $S_D*\alpha_D$. $\alpha_A$ is a rotating angle corresponding to the position A, $\alpha_B$ is a rotating angle corresponding to the position B, $\alpha_C$ is a rotating angle corresponding to the position C, and ap is a rotating angle corresponding to the position D.

In an operation S14, the method may include compensating an exposure process of the wafer based on the actual deviation value.

In some embodiments, after the actual deviation value is measured by the measuring machine, the actual deviation value may be sent to a compensating device. The compensating device may adjust the exposure process of the wafer 10 based on the actual deviation value, such that a position required to be exposed may be located in a window for the exposure process. In this way, a possibility of the wafer 10 failing to be exposed and being scrapped due to the alignment accuracy between the wafer 10 and the carrier wafer being lower may be reduced. Accordingly, a production cost may be greatly reduced and a competitiveness of a product may be improved.

It should be noted that, in the method for stacking multi-layer wafers described above, other processes after an exposure compensation are the same as or similar to those in the prior art, and the same or similar technical effects may be achieved. Reference may be made to a method for stacking the multi-layer wafers in the prior art for details, which will not be repeated herein.

In the method for stacking the multi-layer wafers provided in the embodiments of the present disclosure, after bonding the wafer 10 and the carrier wafer, the overlay deviation values of the different positions of the first feature pattern 20 relative to the carrier wafer may be further acquired. The overlay deviation values corresponding to the different positions may be fitted, and the actual deviation value of the wafer 10 after the wafer 10 is bonded to the carrier wafer may be acquired. The exposure process of the wafer 10 may be compensated based on the actual deviation value, such that the position required to be exposed may be located in the window for the exposure process. In this way, an occurrence of the wafer 10 failing to be exposed and being scrapped due to the alignment accuracy between the wafer 10 and the carrier wafer being lower may be reduced.

As shown in FIG. 9, FIG. 9 is a schematic structural diagram of a system for stacking multi-layer wafers according to an embodiment of the present disclosure. In the present embodiment, the system 30 for stacking the multi-layer wafers is provided. The system 30 may be configured to measure the overlay deviation values of the wafer 10 and the carrier wafer which are temporarily bonded in a process of stacking the multi-layer wafers 10, and compensate a later exposure process based on a measuring result. In this way, the occurrence of the wafer 10 failing to be exposed and being scrapped due to the alignment accuracy between the wafer 10 and the carrier wafer being lower may be reduced.

In some embodiments, the system 30 may include a measuring device 31 and a compensating device 32.

The measuring device 31 may be configured to acquire the overlay deviation values of the different positions of the first feature pattern 20 on the wafer 10 relative to a carrier wafer after bonding the wafer 10 to the carrier wafer, and configured to fit the overlay deviation values corresponding to the different positions and obtain the actual deviation value of the wafer 10.

In a specific embodiment, the measuring device 31 may be configured to acquire the actual coordinates of the different positions of the first feature pattern 20 relative to the carrier wafer, and acquire the difference values between the actual coordinates corresponding to the different positions and corresponding theoretical coordinates, such that the horizontal offsets in the horizontal axis direction corresponding to the different positions and the horizontal offsets in the vertical axis direction corresponding to the different positions, and the rotating angles corresponding to the different positions may be obtained. Subsequently, the measuring device 31 may be configured to perform the ternary fitting process for three variables, i.e., the horizontal offsets in the horizontal axis direction corresponding to the different positions, the horizontal offsets in the vertical axis direction corresponding to the different positions, and rotating arc lengths corresponding to the different positions, and obtain the actual deviation value of the wafer 10.

The compensating device 32 may be connected to the measuring device 31 and configure to compensate the exposure process of the wafer 10 based on the actual deviation value.

In a specific embodiment, after measuring the actual deviation value, the measuring device 31 may be configured to send the actual deviation value to the compensating device 32. The compensating device 32 may be configured to adjust the exposure process of the wafer 10 based on the actual deviation value, such that the position required to be exposed of the circle 10 may be located in the window for the exposure process window of the lithography machine. In this way, the occurrence of the wafer 10 failing to be exposed and being scrapped due to the alignment accuracy between the wafer 10 and the carrier wafer being lower may be reduced.

It can be understood that the system 30 may also include other devices, such as a bonding device, an exposing device connected to the compensating device 32, etc. Specific structures and functions of these devices may be the same as or similar to those of devices in the prior art. In addition, the same or similar technical effects may be achieved. Details are not repeated herein.

According to the system 30 for stacking the multi-layer wafers provided in some embodiments, the measuring device 31 is configured to acquire the overlay deviation values of the different positions of the first feature pattern 20 relative to the carrier wafer after bonding the wafer 10 and the carrier wafer, and fit the overlay deviation values corresponding to the different positions and obtain an actual deviation value of the wafer 10 after the wafer 10 is bonded to the carrier wafer. In addition, the compensating device 32 connected to the measuring device 31 is configured, such that the measuring device 31 may send the actual deviation value to the compensating device 32 after acquiring the actual deviation value of the wafer 10. In this way, the compensating device 32 may be configured to compensate the exposure process of the wafer 10 based on the actual deviation value, such that the position required to be exposed of the wafer 10 may be located in the window for the exposure process, and the occurrence of the wafer 10 failing to be exposed and being scrapped due to the alignment accuracy between the wafer 10 and the carrier wafer being lower may be reduced.

The above are merely embodiments of the present disclosure, which are not intended to limit a patent scope of the present disclosure. Any equivalent structure transformation or any equivalent process transformation made based on contents of the specification and the accompanying drawings of the present disclosure, or direct or indirect applications in other related technical fields, shall similarly fall in a protecting scope of the present disclosure.

What is claimed is:

1. A method for stacking multi-layer wafers, comprising:
- bonding a wafer to a carrier wafer; wherein a first feature pattern is defined in the wafer;
- acquiring overlay deviation values of different positions of the first feature pattern relative to the carrier wafer;
- fitting the overlay deviation values corresponding to the different positions and obtaining an actual deviation value of the wafer; and
- compensating an exposure process of the wafer based on the actual deviation value;
- wherein the fitting the overlay deviation values corresponding to the different positions and obtaining an actual deviation value of the wafer, comprises:
  - performing a ternary fitting process for horizontal offsets in a horizontal axis direction corresponding to the different positions, horizontal offsets in a vertical axis direction corresponding to the different positions, and rotating arc lengths corresponding to the different positions, and obtaining the actual deviation value of the wafer, wherein a rotating arc length of each position is a product of a distance between the position and a center of the wafer and a corresponding rotating angle.

2. The method for stacking multi-layer wafers according to claim 1, wherein the bonding a wafer to a carrier wafer, comprises:
- providing the wafer and the carrier wafer, wherein the wafer comprises a substrate, a dielectric layer arranged on a side surface of the substrate, and a metal layer embedded in the dielectric layer; and
- defining the first feature pattern on a side surface of the substrate away from the dielectric layer.

3. The method for stacking multi-layer wafers according to claim 1, wherein the bonding a wafer to a carrier wafer, comprises:
- providing the wafer and the carrier wafer, wherein the wafer comprises a substrate, a dielectric layer arranged on a side surface of the substrate, and a metal layer embedded in the dielectric layer; and
- defining the first feature pattern on a side surface of the dielectric layer away from the substrate.

4. The method for stacking multi-layer wafers according to claim 3, wherein the dielectric layer comprises:
- a covering layer, arranged on a side surface of the substrate;
- a bonding layer, arranged on a side surface of the covering layer away from the substrate; and
- a protecting layer, arranged on a side surface of the bonding layer away from the covering layer;
- wherein the defining the first feature pattern on a side surface of the dielectric layer away from the substrate, comprises:
- defining the first feature pattern in a process of fabricating the protecting layer.

5. The method for stacking multi-layer wafers according to claim 1, wherein the bonding a wafer to a carrier wafer, comprises:
- providing the wafer and the carrier wafer, wherein the wafer comprises a substrate, a dielectric layer arranged on a side surface of the substrate, a metal layer embedded in the dielectric layer, and a bonding pad connected to the metal layer and exposed to a side surface of the dielectric layer away from the substrate;
- arranging a barrier layer on the side surface of the dielectric layer away from the substrate, such that the bonding pad is covered by the barrier layer; and
- defining the first feature pattern on the barrier layer.

6. The method for stacking multi-layer wafers according to claim 1, wherein the acquiring overlay deviation values of different positions of the first feature pattern relative to the carrier wafer, comprises:

acquiring actual coordinates of the different positions of the first feature pattern relative to the carrier wafer and rotating angles of the different positions of the first feature pattern relative to the carrier wafer; and acquiring difference values between the actual coordinates corresponding to the different positions and corresponding theoretical coordinates, and acquiring the horizontal offsets in the horizontal axis direction corresponding to the different positions and the horizontal offsets in the vertical axis direction corresponding to the different positions.

7. The method for stacking multi-layer wafers according to claim 1, wherein the different positions of the first feature pattern comprise multiple spacing points of the first feature pattern arranged at intervals along the same direction.

8. The method for stacking multi-layer wafers according to claim 7, wherein the multiple spacing points are arranged at an equal interval.

9. A system for stacking multi-layer wafers, comprising:

a measuring device, configured to acquire overlay deviation values of different positions of a first feature pattern on a wafer relative to a carrier wafer after bonding the wafer to the carrier wafer, and configured to fit the overlay deviation values corresponding to the different positions and obtain an actual deviation value of the wafer; and a compensating device, connected to the measuring device and configured to compensate an exposure process of the wafer based on the actual deviation value;

wherein the measuring device is further configured to perform a ternary fitting process for the horizontal offsets in the horizontal axis direction corresponding to the different positions, the horizontal offsets in the vertical axis direction corresponding to the different positions, and rotating arc lengths corresponding to the different positions, and obtain the actual deviation value of the wafer, wherein a rotating arc length of each position is a product of a distance between the position and a center of the wafer and a corresponding rotating angle.

10. The system for stacking multi-layer wafers according to claim 9, further comprising:

a bonding device, configured to bond the wafer to the carrier wafer.

11. The system for stacking multi-layer wafers according to claim 10, wherein the bonding device is configured to:

provide the wafer and the carrier wafer, wherein the wafer comprises a substrate, a dielectric layer arranged on a side surface of the substrate, and a metal layer embedded in the dielectric layer; and define the first feature pattern on a side surface of the substrate away from the dielectric layer.

12. The system for stacking multi-layer wafers according to claim 10, wherein the bonding device is configured to provide the wafer and the carrier wafer, wherein the wafer comprises a substrate, a dielectric layer arranged on a side surface of the substrate, and a metal layer embedded in the dielectric layer; and define the first feature pattern on a side surface of the dielectric layer away from the substrate.

13. The system for stacking multi-layer wafers according to claim 12, wherein the dielectric layer comprises:

a covering layer, arranged on a side surface of the substrate;

a bonding layer, arranged on a side surface of the covering layer away from the substrate; and a protecting layer, arranged on a side surface of the bonding layer away from the covering layer;

wherein the bonding device is further configured to define the first feature pattern in a process of fabricating the protecting layer.

14. The system for stacking multi-layer wafers according to claim 10, wherein the bonding device is configured to provide the wafer and the carrier wafer, wherein the wafer comprises a substrate, a dielectric layer arranged on a side surface of the substrate, a metal layer embedded in the dielectric layer, and a bonding pad connected to the metal layer and exposed to a side surface of the dielectric layer away from the substrate;

arrange a barrier layer on the side surface of the dielectric layer away from the substrate, such that the bonding pad is covered by the barrier layer; and define the first feature pattern on the barrier layer.

15. The system for stacking multi-layer wafers according to claim 9, wherein the measuring device is further configured to acquire actual coordinates of the different positions of the first feature pattern relative to the carrier wafer and rotating angles of the different positions of the first feature pattern relative to the carrier wafer; and acquire difference values between the actual coordinates corresponding to the different positions and corresponding theoretical coordinates, and acquire horizontal offsets in a horizontal axis direction corresponding to the different positions and horizontal offsets in a vertical axis direction corresponding to the different positions.

16. The system for stacking multi-layer wafers according to claim 9, wherein the different positions of the first feature pattern comprise multiple spacing points of the first feature pattern arranged at intervals along the same direction.

17. The system for stacking multi-layer wafers according to claim 16, wherein the multiple spacing points are arranged at an equal interval.

18. A system for stacking multi-layer wafers, comprising:

a measuring device, configured to acquire overlay deviation values of different positions of a first feature pattern on the wafer relative to a carrier wafer after bonding the wafer to the carrier wafer; and configured to fit the overlay deviation values corresponding to the different positions and obtain an actual deviation value of the wafer;

a compensating device, connected to the measuring device and configured to compensate an exposure process of the wafer based on the actual deviation value; and an exposing device, connected to the compensating device and configured to perform an exposure process for the multi-layer wafers;

wherein the measuring device is further configured to perform a ternary fitting process for the horizontal offsets in the horizontal axis direction corresponding to the different positions, the horizontal offsets in the vertical axis direction corresponding to the different positions, and rotating arc lengths corresponding to the different positions, and obtain the actual deviation value of the wafer, wherein a rotating arc length of each position is a product of a distance between the position and a center of the wafer and a corresponding rotating angle.

* * * * *